United States Patent
Hori et al.

(10) Patent No.: US 9,030,077 B2
(45) Date of Patent: May 12, 2015

(54) SWITCHING APPARATUS AND TEST APPARATUS

(75) Inventors: Hisao Hori, Miyagi (JP); Yoshikazu Abe, Miyagi (JP); Yoshihiro Sato, Miyagi (JP)

(73) Assignee: Advantest Corporation, Tokyo (JP)

( * ) Notice: Subject to any disclaimer, the term of this patent is extended or adjusted under 35 U.S.C. 154(b) by 668 days.

(21) Appl. No.: 13/275,342

(22) Filed: Oct. 18, 2011

(65) Prior Publication Data

US 2013/0037395 A1 Feb. 14, 2013

(30) Foreign Application Priority Data

Dec. 3, 2010 (JP) ................................. 2010-269963

(51) Int. Cl.
- H01L 41/09 (2006.01)
- H01L 41/04 (2006.01)
- G01R 31/28 (2006.01)
- H01H 57/00 (2006.01)
- G01R 31/319 (2006.01)

(52) U.S. Cl.
CPC ............ *H01L 41/094* (2013.01); *H01L 41/042* (2013.01); *H01L 41/0913* (2013.01); *H01H 2057/006* (2013.01); *G01R 31/31926* (2013.01); *G01R 31/2889* (2013.01)

(58) Field of Classification Search
USPC ................ 310/316.01, 317, 328, 330–332
See application file for complete search history.

(56) References Cited

U.S. PATENT DOCUMENTS

| RE33,691 E | * | 9/1991 | Harnden et al. | ............... | 310/332 |
| 2005/0194867 A1 | * | 9/2005 | Kawakubo et al. | ........... | 310/348 |
| 2010/0263997 A1 | * | 10/2010 | Hilgers | .......................... | 200/181 |
| 2012/0212101 A1 | * | 8/2012 | Tabata et al. | ................... | 310/319 |
| 2012/0268102 A1 | * | 10/2012 | Hori et al. | .................. | 324/76.11 |
| 2013/0026021 A1 | * | 1/2013 | Hori et al. | ...................... | 200/5 A |

FOREIGN PATENT DOCUMENTS

| JP | S62-141789 A | 6/1987 |
| JP | H04-43684 A | 2/1992 |
| JP | H05-129672 A | 5/1993 |

(Continued)

OTHER PUBLICATIONS

Office Action issued in counterpart Japanese Application No. 2010-269963, mailed on Jan. 4, 2011, and machine translation thereof.

(Continued)

*Primary Examiner* — Thomas Dougherty

(57) ABSTRACT

A switching apparatus comprising a contact point section including a first contact point; an actuator including a first piezoelectric film that expands and contracts according to a first drive voltage and a second piezoelectric film provided in parallel with the first piezoelectric film and expands and contracts according to a second drive voltage, and a control section that controls the first drive voltage and the second drive voltage is provided. The actuator moves a second contact point to contact or move away from the first contact point according to the contraction and expansion of the first piezoelectric film and the second piezoelectric film. When switching from a contact state to a separated state, the control section stops supplying the first drive voltage and applies the second drive voltage causing the second piezoelectric film to contract to the second piezoelectric film, such that the actuator is biased to return.

13 Claims, 6 Drawing Sheets

(56) References Cited

FOREIGN PATENT DOCUMENTS

| JP | H05-206537 A | 8/1993 |
|----|--------------|--------|
| JP | 2000-80540 A | 3/2000 |
| JP | 2001-191300 A | 7/2001 |
| JP | 2003-209302 A | 7/2003 |
| JP | 2004-109277 A | 4/2004 |
| JP | 2005-332802 A | 12/2005 |

OTHER PUBLICATIONS

"Explanation of reasons for accelerated examination" submitted to the JPO for application No. 2010-269963 (JP counterpart to U.S. Appl. No. 13/275,342) and machine translation thereof.

\* cited by examiner

SWITCHING APPARATUS AND TEST APPARATUS

BACKGROUND

1. Technical Field

The present invention relates to a switching apparatus and a test apparatus.

2. Related Art

A conventional actuator is known that is formed by layering piezoelectric films and electrodes that apply voltage to the piezoelectric films, as shown in Patent Document 1, for example.

Patent Document 1: Japanese Patent Application Publication No. 2001-191300

However, when this actuator is used as a switch that moves contact points into contact with each other or away from each other by expanding and contracting the piezoelectric films, the contact points can stick together and become unable to be disconnected from each other. Furthermore, charge is accumulated in the piezoelectric films due to drive voltage being applied to the piezoelectric films, and therefore it can be difficult to effectively apply the drive voltage to all of the piezoelectric films.

SUMMARY

Therefore, it is an object of an aspect of the innovations herein to provide a switching apparatus and a test apparatus, which are capable of overcoming the above drawbacks accompanying the related art. The above and other objects can be achieved by combinations described in the independent claims. The dependent claims define further advantageous and exemplary combinations of the innovations herein. According to a first aspect related to the innovations herein, provided is a switching apparatus comprising a contact point section including a first contact point; an actuator including a first piezoelectric film that expands and contract according to a first drive voltage and a second piezoelectric film that is provided in parallel with the first piezoelectric film and expands and contract according to a second drive voltage, the actuator moving a second contact point to contact or move away from the first contact point according to the contraction and expansion of the first piezoelectric film and the second piezoelectric film; and a control section that controls the first drive voltage and the second drive voltage. When causing the first contact point and the second contact point to contact each other, the control section applies the first drive voltage causing the first piezoelectric film to contract to the first piezoelectric film, such that the actuator bends toward the first piezoelectric film, and when switching the first contact point and the second contact point from a contact state to a separated state, the control section stops supplying the first drive voltage and applies the second drive voltage causing the second piezoelectric film to contract to the second piezoelectric film, such that the actuator is biased to return.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
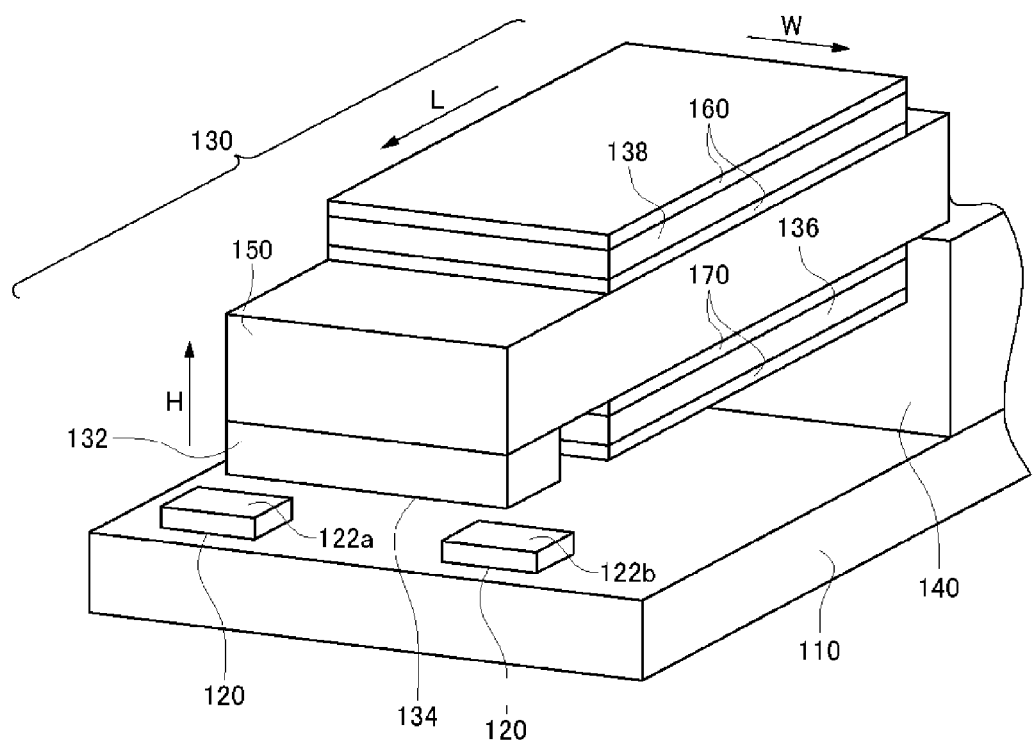
FIG. 1 shows an exemplary configuration of a switching apparatus 100 according to an embodiment of the present invention.
Figure 2:
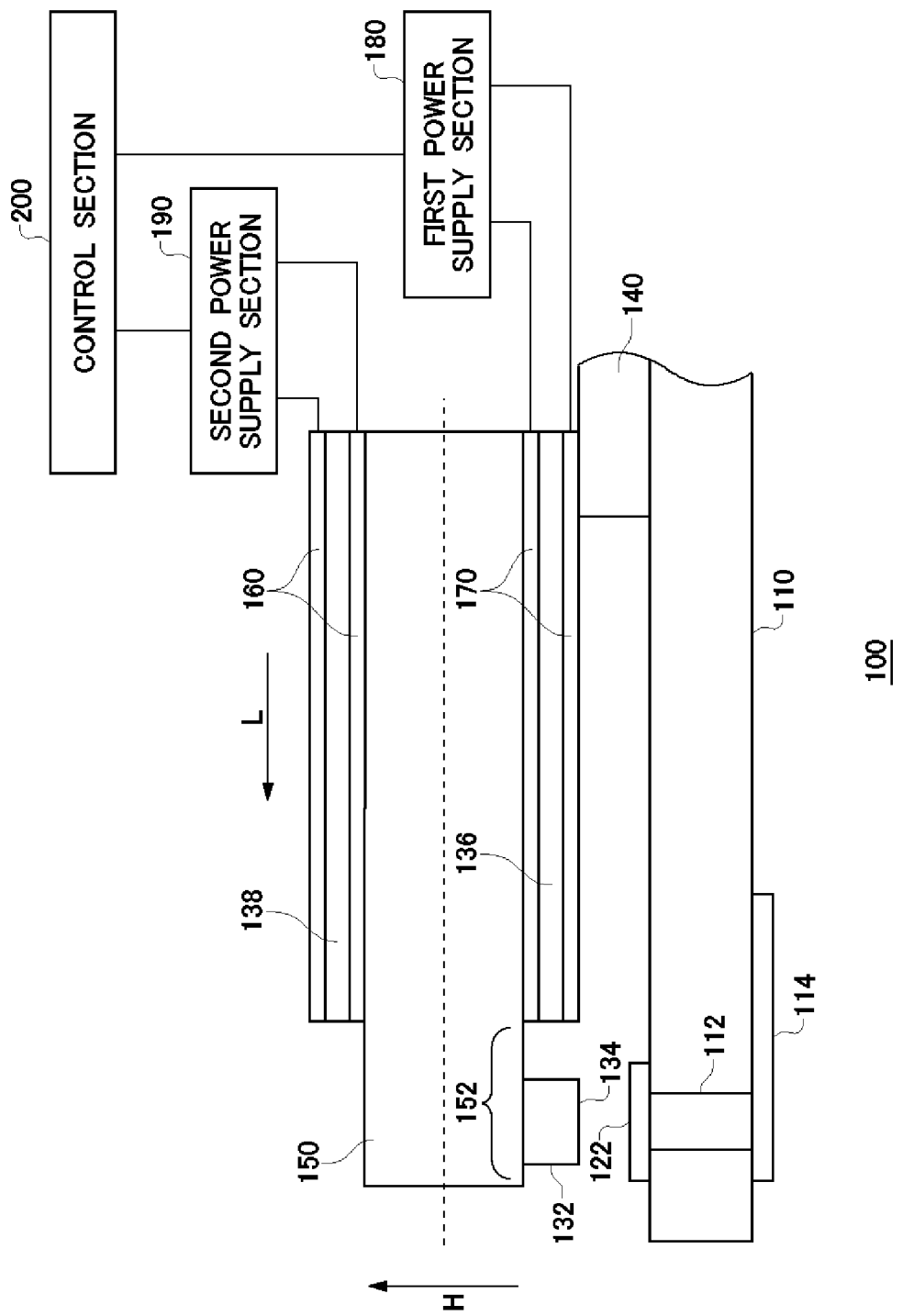
FIG. 2 shows a side view of the switching apparatus 100 according to the present embodiment.

FIG. 1 shows an exemplary configuration of a switching apparatus 100 according to an embodiment of the present invention. FIG. 2 shows a side view of the switching apparatus 100 according to the present embodiment. The switching apparatus 100 causes a first contact point 122 and a second contact point 134 to contact each other by applying a first drive voltage to a first piezoelectric film, and causes the first contact point 122 and the second contact point 134 to move away from each other by stopping the supply of the first drive voltage to the first piezoelectric film and applying a second drive voltage to a second piezoelectric film. The switching apparatus 100 includes a substrate 110, a first contact point section 120, an actuator 130, a base portion 140, a first power supply section 180, a second power supply section 190, and a control section 200.

The substrate 110 includes a flat first surface on which the first contact point section 120 is disposed. The substrate 110 may be an insulator. The substrate 110 may be an insulating glass substrate, or may be a semiconductor substrate made of silicon, for example. The substrate 110 includes a via 112 and a wiring section 114. The substrate 110 may include the wiring section 114 on a second surface thereof, which is different from the first surface on which the first contact point section 120 is provided. If the switching apparatus 100 is housed in a package, the substrate 110 may be a portion of the package.

The via 112 is formed of metal and electrically connects the first contact point section 120 to the wiring section 114. The via 112 may be formed to maintain a sealed state by being filled with a conductive material. The substrate 110 may include a plurality of vias 112 corresponding to the number of first contact point sections 120 disposed on the substrate 110.

The wiring section 114 transmits a signal passed through the switching apparatus 100. The wiring section 114 may be a wiring pattern provided on the second surface of the substrate 110 to receive or transmit a signal to or from at least one via 112. The wiring section 114 may include a land, a connector, or an antenna, and may transmit and receive signals passed through the switching apparatus 100 from the outside.

The first contact point section 120 includes a first contact point 122. The first contact point 122 may be a flat surface without any protrusions. The first contact point section 120 may include aluminum, tungsten, palladium, rhodium, gold, platinum, ruthenium, indium, iridium, osmium, molybdenum, and/or nickel. The first contact point 122 may be an alloy of two or more of the above materials.

In the present embodiment, the switching apparatus 100 includes two first contact point sections 120 on the substrate 110, and two first contact points 122 of the first contact point sections 120 are brought into contact with and moved away from one second contact point 134. For example, signal transmission from one of the first contact points 122a to the other first contact point 122b, via the second contact point 134, can be turned ON/OFF. In this case, the wiring section 114 transmits a signal from the outside to the first contact point 122a, and this signal is transmitted from the first contact point 122b to the outside when the switching apparatus 100 is ON.

Instead, the switching apparatus 100 may include one first contact point section 120 on the substrate 110, a wiring section that transmits a signal from the outside to the second contact point 134 via the actuator 130 may be provided on the actuator 130, and the one first contact point 122 may be brought into contact with and moved away from the second contact point 134. In this way, the switching apparatus 100 can switch the signal transmission from the second contact point 134 to the first contact point 122 ON/OFF. The wiring section 114 transmits a signal received from the outside to the outside from the first contact point 122 when the switching apparatus 100 is ON.

The actuator 130 moves the second contact point 134 to contact or move away from the first contact point 122. The actuator 130 may be deposited using a semiconductor process. The actuator 130 includes a second contact point section 132, a first piezoelectric film 136, a second piezoelectric film 138, a first support layer 150, electrode layers 170 of the first piezoelectric film 136, electrode layers 160 of the second piezoelectric film 138, and an exposed area 152.

The second contact point 134 is provided on the second contact point section 132. The second contact point section 132 may include the same metal as the first contact point section 120. The second contact point 134 may be a flat surface without any protrusions, so as to contact the surface of the first contact point 122. Instead, the second contact point 134 may be semispherical in order to prevent degradation or damage of the first contact point 122, or may have a tip shaped as a rounded needle. For example, the second contact point 134 may have a predetermined shape that, when the second contact point 134 contacts the first contact point 122 to form a transmission path, creates a signal path having a width corresponding to the frequency of the signal being transmitted.

The first piezoelectric film 136 expands and contracts according to the first drive voltage. The first piezoelectric film 136 is arranged to expand and contract in the longitudinal direction of the actuator 130 when the first drive voltage is applied thereto, such that the actuator 130 curves to change the distance between the first contact point 122 and the second contact point 134.

Perovskite ferroelectric substances such as barium titanate (BTO), lead lanthanum zirconate titanate (PLZT), Lead zirconate titanate (PZT), aluminum nitride (AlN), or a zinc oxide (ZnO) wurtzite crystal may be used as the first piezoelectric film 136. For example, the first piezoelectric film 136 may be made of PZT and have a width in the W direction of 90 μm, a length in the L direction of 750 μm, and a height in the H direction of 0.5 μm.

The second piezoelectric film 138 is provided in parallel with the first piezoelectric film 136, and expands and contracts according to the second drive voltage. The second piezoelectric film 138 may be formed using perovskite ferroelectric substances, in the same manner as the first piezoelectric film 136. The second piezoelectric film 138 preferably uses substantially the same material and has substantially the same shape as the first piezoelectric film 136. For example, the second piezoelectric film 138 may be made of PZT and have a width in the W direction of 90 μm, a length in the L direction of 750 μm, and a height in the H direction of 0.5 μm.

The actuator 130 moves the second contact point 134 to contact or move away from the first contact point 122, according to the expansion and contraction of the first piezoelectric film 136 and the second piezoelectric film 138. The first piezoelectric film 136 and the second piezoelectric film 138 may be arranged on both sides, in the height direction, of the center plane of the actuator 130. The first piezoelectric film 136 and the second piezoelectric film 138 are at substantially the same distance in the height direction from the central plane of the actuator 130. The actuator 130 may include a plurality of films that are layered substantially symmetrically with respect to the central plane of the actuator 130 in the height direction. In FIG. 2, the dashed line indicates the central plane in the height direction of the actuator 130.

The support layer 150 is provided between the first piezoelectric film 136 and the second piezoelectric film 138. The support layer 150 is elastic and deforms when force is applied thereto, so that the actuator 130 bends when the first piezoelectric film 136 expands or contracts to exert a force on the support layer 150. The support layer 150 is rigid enough to prevent the actuator 130 from being bent too much, and to return the actuator 130 to the initial position when the first piezoelectric film 136 is not applying a force.

A conductor such as aluminum, gold, or platinum, an insulator such as glass, or a semiconductor such as silicon may be used for the support layer 150.

When forming the first piezoelectric film 136 and/or the second piezoelectric film 138, the support layer 150 is heated to a firing temperature along with the first piezoelectric film 136 and/or the second piezoelectric film 138. Therefore, the support layer 150 is made from a material that is not damaged when heated to the firing temperature of the first piezoelectric film 136 and/or the second piezoelectric film 138. In other words, the support layer 150 is preferably made of a material that does not exhibit physical damage such as cracks or fissures when heated to the firing temperature of the first piezoelectric film 136 and/or the second piezoelectric film 138. Specifically, if the first piezoelectric film 136 and the second piezoelectric film 138 are made of PZT, for example, the firing temperature can exceed 700° C.

Furthermore, the first support layer 150 is preferably made of a material that is unlikely to cause a chemical reaction with the piezoelectric films or the electrode layers when heated to the firing temperature of the first piezoelectric film 136 and the second piezoelectric film 138. The first support layer 150 is preferably made of a material that forms a compound with the piezoelectric films or the electrode layers as a result of being heated to the firing temperature of the piezoelectric films, and that does not exhibit physical damage such as cracks or fissures. In this case, the first support layer 150 is preferably made of a material that does not degrade the film characteristics, such as the piezoelectric constant, of the first piezoelectric film 136 or the second piezoelectric film 138 when heated to the firing temperature of the piezoelectric films.

The support layer 150 may be an insulating layer. By forming the support layer 150 as an insulating layer, the support layer 150 can tolerate the firing temperature of the piezoelectric films at approximately 700° C. and can be formed using a method such as CVD that is less expensive than a metal film.

The support layer 150 may include silicon oxide ($SiO_2$) or silicon nitride (SiN). The support layer 150 may be silicon oxide ($SiO_2$), for example. Instead, the support layer 150 may be silicon nitride (SiN), for example. The support layer 150 may be made of silicon oxide ($SiO_2$) and have a width in the W direction of 90 μm, a length in the L direction of 750 μm, and a height in the H direction of 4 μm.

The electrode layers 160 are formed on the top and bottom surfaces of the first piezoelectric film 136 and the electrode layers 170 are formed on the top and bottom surfaces of the second piezoelectric film 138, and each apply a drive voltage. The electrode layers 160 and the electrode layers 170 are each flat and extend in the length direction L of the actuator 130. The electrode layers 160 and the electrode layers 170 may be made from metals that can be easily processed with low resistance, such as aluminum, gold, platinum, copper, indium, tungsten, molybdenum, ruthenium, and iridium, oxide compound electrodes such as ruthenium oxide ($RuO_2$) and iridium oxide ($IrO_2$), ceramic electrodes, or semiconductors such as silicon.

If silicon is used as the electrode material, the silicon is preferably doped to have high impurity density. For example, the electrode layers 160 and the electrode layers 170 may each be made of platinum and have a height of 0.25 μm in the height direction H. If the platinum is deposited using a vacuum deposition technique such as sputtering, the platinum may be deposited after depositing titanium or tantalum, for example.

The electrode layers 160 and the electrode layers 170 may include electrode layers formed of platinum or oxide film. If the support layer 150 is made of silicon oxide, for example, the electrodes made of platinum or oxide film in this way can prevent the silicon oxide component from reacting with the first piezoelectric film 136 and/or the second piezoelectric film 138 as a result of the thermal processing during the manufacturing of the electrodes.

The exposed area 152 is a portion of the support layer 150 at one end thereof, which is the moving end of the actuator 130, where the first piezoelectric film 136 and the second piezoelectric film 138 are not formed. The second contact point 134 may be formed on the exposed area 152. Instead, the second contact point 134 may be formed on the first piezoelectric film 136. In this case, the support layer 150 may be covered by the first piezoelectric film 136 and the electrode layers 170 up to the tip thereof The portion of the electrode layer 170 facing the substrate 110 and positioned at the tip of the actuator 130 may operate as the second contact point 134. In this case, in order to prevent loss during high-frequency signal transmission, the second contact point 134 is provided on the surface of the first piezoelectric film 136 and is electrically isolated from the rest of the electrode layer 170.

The base portion 140 is arranged on the substrate 110 at a position near the first contact point section 120 but distanced therefrom. The base portion 140 may be formed of $SiO_2$, for example. Instead, the base portion 140 may be a portion of the substrate 110 formed of silicon or glass, for example. The height of the base portion 140 is equal to or less than the maximum displacement of the actuator 130. The maximum displacement of the actuator 130 refers to the displacement of the actuator 130 when the maximum drive voltage is applied to the first piezoelectric film 136.

The actuator 130 may be fixed on the substrate 110 via the base portion 140, for example. The actuator 130 is supported at one end of the base portion 140 in the length direction L. When the first drive voltage is applied to the first piezoelectric film 136, the end of the actuator 130 on the second contact point side that is not supported by the base portion 140 bends in the height direction, which results in downward displacement or upward displacement in FIG. 2.

The first power supply section 180 applies the first drive voltage to the first piezoelectric film 136. The first power supply section 180 applies the first drive voltage to the first piezoelectric film 136 when brining the first contact point 122 and the second contact point 134 into contact with each other to turn ON the switching apparatus 100. The first power supply section 180 may stop the supply of the first drive voltage to the first piezoelectric film 136 when moving the first contact point 122 and the second contact point 134 away from each other to turn OFF the switching apparatus 100. Instead, the first power supply section 180 may apply the first drive voltage to the first piezoelectric film 136 when turning OFF the switching apparatus 100, and may stop the supply of the first drive voltage to the first piezoelectric film 136 when turning ON the switching apparatus 100.

The second power supply section 190 applies the second drive voltage to the second piezoelectric film 138. The second power supply section 190 applies the second drive voltage to the second piezoelectric film 138 when moving the first contact point 122 and the second contact point 134 away from each other to turn OFF the switching apparatus 100. The second power supply section 190 may stop the supply of the second drive voltage to the second piezoelectric film 138 when moving the first contact point 122 and the second contact point 134 into contact with each other to turn ON the switching apparatus 100. Instead, the second power supply section 190 may apply the second drive voltage to the second piezoelectric film 138 when turning ON the switching apparatus 100, and may stop the supply of the second drive voltage to the second piezoelectric film 138 when turning OFF the switching apparatus 100.

The control section 200 controls the first power supply section 180 outputting the first drive voltage and the second power supply section 190 outputting the second drive voltage. The control section 200 may supply the first piezoelectric film 136 and the second piezoelectric film 138 respectively with the first drive voltage and the second drive voltage set to predetermined values. The control section 200 may be hardware such as an electronic circuit, or may instead be software that operates according to a program, for example.

When brining the first contact point 122 and the second contact point 134 into contact with each other, the control section 200 applies to the first piezoelectric film 136 a first drive voltage causing the first piezoelectric film 136 to contract, thereby causing the actuator 130 to bend toward the first piezoelectric film 136. When moving the first contact point 122 away from the second contact point 134 to switch from the contact state to a separated state, the control section 200 stops the supply of the first drive voltage and applies to the second piezoelectric film 138 a second drive voltage causing the second piezoelectric film 138 to contract, thereby biasing the actuator 130 in a return direction.

Instead, when brining the first contact point 122 and the second contact point 134 into contact with each other, the control section 200 may apply to the second piezoelectric film 138 a second drive voltage causing the second piezoelectric film 138 to expand, thereby causing the actuator 130 to bend toward the first piezoelectric film 136. When moving the first contact point 122 away from the second contact point 134 to switch from the contact state to a separated state, the control section 200 may stop the supply of the second drive voltage and apply to the first piezoelectric film 136 a first drive voltage causing the first piezoelectric film 136 to expand, thereby biasing the actuator 130 toward the initial position.

The switching apparatus 100 according to the above embodiment can turn ON/OFF the transmission of a signal input thereto. For example, the actuator 130 of the present embodiment may be formed by layering, in the height direction H, an electrode layer 170 (platinum, 0.25 µm), a second piezoelectric film 138 (PZT, 0.5 µm), an electrode layer 170 (platinum, 0.25 µm), a first support layer 150 ($SiO_2$, 4 µm), an electrode layer 160 (platinum, 0.25 µm), a first piezoelectric film 136 (PZT, 0.5 µm), and an electrode layer 160 (platinum, 0.25 µm). The actuator 130 may have a total height of 6 µm, and the portions other than the second contact point section 132 may be formed symmetrically with respect to the height.

Figure 3:
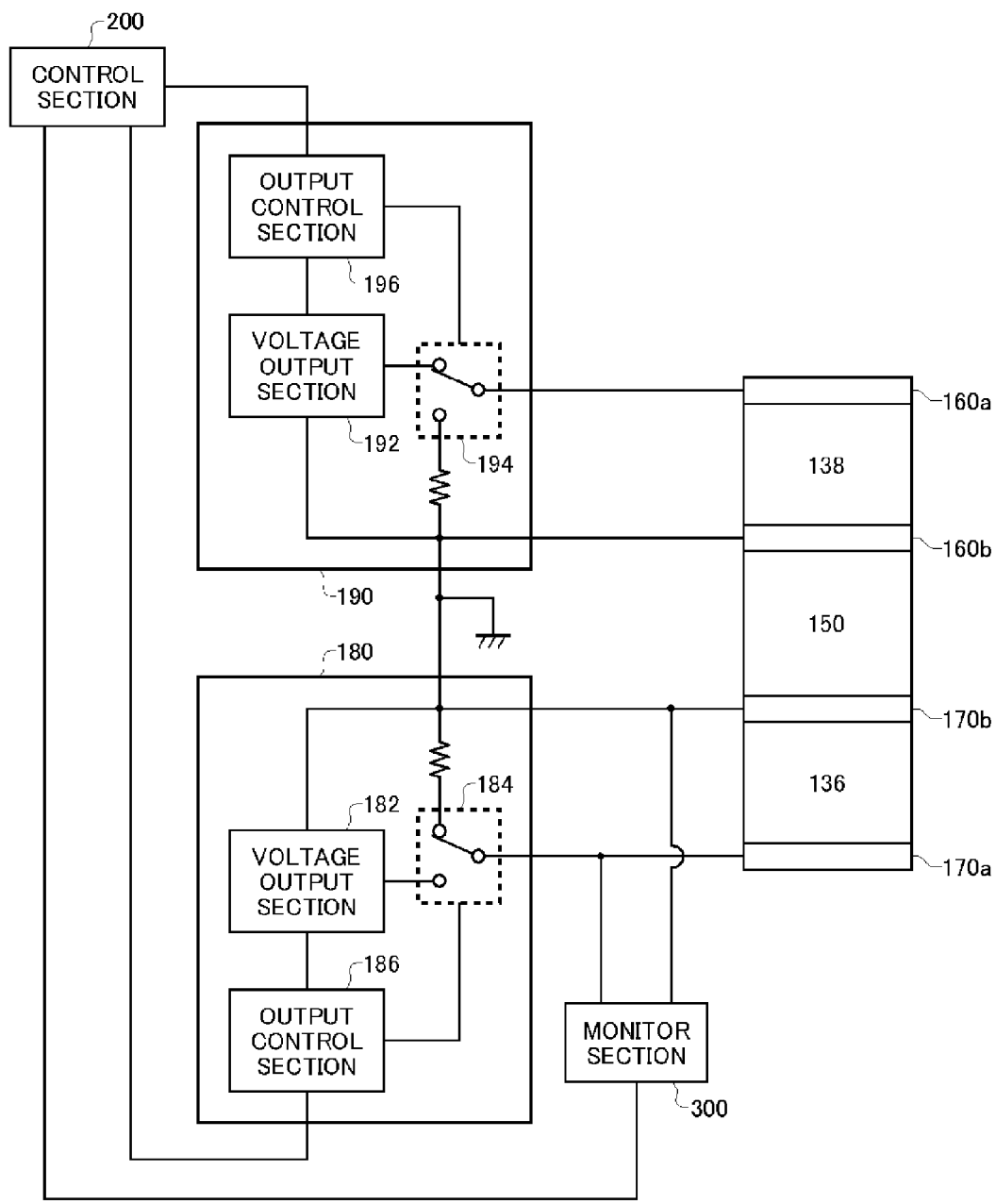
FIG. 3 shows exemplary configurations of the control section 200, the first power supply section 180, and the second power supply section according to the present embodiment, along with the actuator 130.

FIG. 3 shows exemplary configurations of the control section 200, the first power supply section 180, and the second power supply section according to the present embodiment, along with the actuator 130. The first power supply section 180 includes a voltage output section 182, an output switching section 184, and an output control section 186.

The voltage output section 182 outputs the first drive voltage. The voltage output section 182 may output the first drive voltage as instructed by the output control section 186.

The output switching section 184 switches whether the first drive voltage is supplied to the first piezoelectric film 136. The output switching section 184 switches whether the first drive voltage is supplied according to a control signal from the output control section 186. In the present example, the output switching section 184 switches to a reference potential of 0 V to indicate that the first drive voltage is not supplied. Instead, the output switching section 184 may switch to a voltage that does not drive the first piezoelectric film 136.

The output control section 186 instructs the voltage output section 182 concerning the value of the first drive voltage supplied to the first piezoelectric film 136. The output control section 186 may set a predetermined value for the first drive voltage based on a control signal from the control section 200, or may set the value for the first drive voltage based on a control signal from the control section 200. The output control section 186 turns the output switching section 184 ON/OFF according to a control signal received from the control section 200.

The second power supply section 190 includes a voltage output section 192, an output switching section 194, and an output control section 196. The voltage output section 192 outputs the second drive voltage. The voltage output section 192 may output the second drive voltage as instructed by the output control section 196.

The output switching section 194 switches whether the second drive voltage is supplied to the second piezoelectric film 138. The output switching section 194 switches whether the second drive voltage is supplied according to a control signal from the output control section 196. In the present example, the output switching section 194 switches to a reference potential of 0 V to indicate that the second drive voltage is not supplied. Instead, the output switching section 194 may switch to a voltage that does not drive the second piezoelectric film 138.

The output control section 196 instructs the voltage output section 192 concerning the value of the second drive voltage supplied to the second piezoelectric film 138, according to a control signal received from the control section 200. The output control section 196 may set a predetermined value for the second drive voltage based on a control signal from the control section 200, or may set the value for the second drive voltage based on a control signal from the control section 200.

The output control section 196 turns the output switching section 194 ON/OFF according to a control signal received from the control section 200.

When bringing the first contact point 122 and the second contact point 134 into contact with each other, the control section 200 applies a first drive voltage causing the first piezoelectric film 136 to expand from the first power supply section 180 to the first piezoelectric film 136. In this case, the output control section 186 outputs the first drive voltage from the voltage output section 182 and turns ON the output switching section 184. Furthermore, the control section 200 does not supply the second drive voltage from the second power supply section 190. In this case, the output control section 196 turns OFF the output switching section 194.

When switching the first contact point 122 and the second contact point 134 from a contact state to a separated state, the control section 200 of the present embodiment stops the supply of the first drive voltage. In this case, the output control section 186 turns OFF the output switching section 184. Furthermore, the control section 200 applies to the second piezoelectric film 138 a second drive voltage that causes the second piezoelectric film 138 to contract, thereby biasing the actuator 130 in the return direction. In this case, the output control section 196 outputs the second drive voltage from the voltage output section 192 and turns ON the output switching section 194.

In the manner described above, the switching apparatus 100 of the present embodiment can turn ON/OFF the transmission of a signal input thereto by switching the drive voltage to contract the first piezoelectric film 136 or the second piezoelectric film 138. Furthermore, the switching apparatus 100 can bias the actuator 130 in the return direction by contracting the second piezoelectric film 138 when in the OFF state, to prevent the contact points from sticking together.

The control section 200 may switch whether the actuator 130 is biased in the return direction by the second piezoelectric film 138, according to the state of the actuator 130. If the actuator 130 is rigid, the actuator 130 will return to the initial position when the force is no longer applied by the first piezoelectric film 136. Accordingly, when the switching apparatus 100 is OFF, the control section 200 need not use the second piezoelectric film 138 to bias the actuator 130 in the return direction if the actuator 130 is rigid.

The control section 200 sets the cumulative usage time of the actuator 130 as a state of the actuator 130. For example, the control section 200 may switch whether the actuator 130 is biased in the return direction by the second piezoelectric film 138 according to a predetermined cumulative usage time. In this way, the switching apparatus 100 biases the actuator 130 in the return direction using the second piezoelectric film 138 when the rigidity of the actuator 130 has decreased due to the cumulative usage time, thereby preventing the contact points from sticking together and maintaining a substantially constant shut-off time for the switching.

The control section 200 may set initial positions of the first contact point 122 and the second contact point 134 in the separated state as a state of the actuator 130. For example, since the actuator 130 gradually loses rigidity due to accumulated wear, the initial position of the second contact point 134 moves toward the first contact point 122. Accordingly, the switching apparatus 100 can bias the actuator 130 in the return direction using the second piezoelectric film 138 according to the initial position of the actuator 130, thereby preventing the contact points from sticking together and maintaining a substantially constant shut-off time for the switching.

The switching apparatus 100 may include a monitor section 300 that measures the initial position of the actuator 130. The monitor section 300 may measure a displacement voltage when the applied voltage is not supplied to the first piezoelectric film 136 or the second piezoelectric film 138. For example, the monitor section 300 may be connected to the electrode layer 170a and the electrode layer 170b, and detect the potential difference between these electrode layers to be the displacement voltage generated by the second piezoelectric film 138.

The control section 200 may switch whether the actuator 130 is biased in the return direction by the second piezoelectric film 138 according to a desired switching speed. If the switching speed required when switching the switching apparatus 100 from ON to OFF is low enough that the rigidity of the actuator 130 causes the actuator 130 to return to the initial position quickly enough, there is no need for the control section 200 to bias the actuator 130 in the return direction using the second piezoelectric film 138.

If the switching speed desired when switching the switching apparatus 100 from ON to OFF is high enough that the rigidity of the actuator 130 does not cause the actuator 130 to return to the initial position quickly enough, the control section 200 biases the actuator 130 in the return direction using the second piezoelectric film 138. In this way, the switching apparatus 100 does not apply the drive voltages to the piezoelectric films when the necessary switching speed is low, and therefore the lifetime of the piezoelectric films is increased.

When separating the first contact point 122 from the second contact point 134, the control section 200 may remove the charge accumulated in the first piezoelectric film 136. For example, when stopping the supply of the first drive voltage from the voltage output section 182, the output switching section 184 may connect the electrode layer 170a to a reference potential of 0 V. In this way, the control section 200 can remove the charge accumulated in the electrode layer 170a due to the application of the first drive voltage. In this case, the output switching section 184 preferably connects the electrode layer 170a to the reference potential of 0 V via a resistor.

In the same manner, when setting the first contact point 122 and the second contact point 134 to the contact state, the control section 200 may remove the charge accumulated in the second piezoelectric film 138. For example, when stopping the supply of the second drive voltage from the voltage output section 192, the output switching section 194 may connect the electrode layer 160a to a reference potential of 0 V. In this way, the control section 200 can remove the charge accumulated in the electrode layer 160a due to the application of the second drive voltage. In this case, the output switching section 194 preferably connects the electrode layer 160a to the reference potential of 0 V via a resistor.

When moving the second contact point 134 toward the first contact point 122, the control section 200 may apply a first drive voltage that causes the first piezoelectric film 136 to contract and apply a second drive voltage that causes the second piezoelectric film 138 to expand by providing an electric field that is weaker than the coercive electric field of the second piezoelectric film 138. For example, the piezoelectric films can be expanded by applying a voltage thereto that is less than the voltage causing the piezoelectric films to contract.

Figure 4:
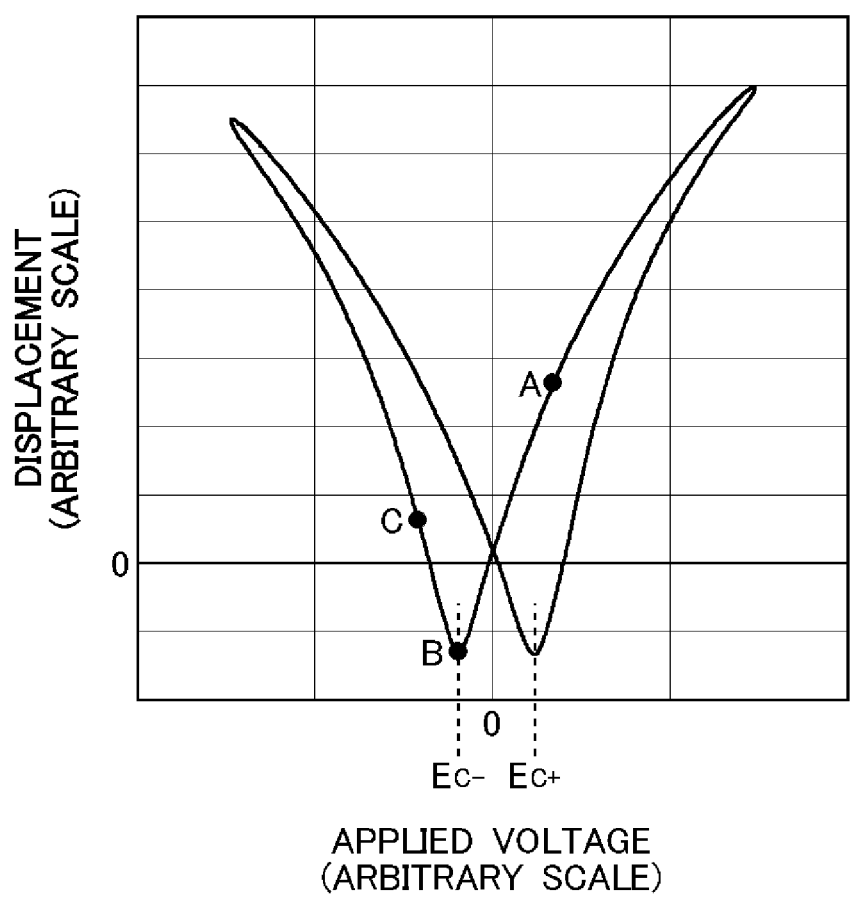
FIG. 4 shows exemplary characteristics of displacement and voltage applied to a piezoelectric film according to the present embodiment.

FIG. 4 shows exemplary characteristics of displacement and voltage applied to a piezoelectric film according to the present embodiment. In FIG. 4, the horizontal axis indicates the voltage applied to the piezoelectric film. The vertical axis indicates the displacement of the piezoelectric film due to the applied voltage. As shown in FIG. 4, the characteristic of the piezoelectric film concerning applied voltage and displacement follows a hysteresis curve. Accordingly, when the first piezoelectric film 136 and the second piezoelectric film 138 have such a characteristic, the drive voltage is preferably set in a range from point A to point B, for example, indicating an approximately linear relationship between the applied voltage and the displacement.

In the present embodiment, the displacement of the piezoelectric film is inverted when the sign of the applied voltage in the range from point A to point B is inverted. For example, if the piezoelectric film is contracted at point A, the piezoelectric film will be expanded at point B. However, when the absolute value of the applied voltage goes beyond point B, the displacement of the piezoelectric film will invert from expansion to contraction. For example, the piezoelectric film contracts at point C. In this way, the "coercive electric field" refers to the electric field applied to the piezoelectric film when an applied voltage of Ec− or Ec+ causing the displacement to invert is applied to the piezoelectric film.

Since the piezoelectric film has a complicated characteristic that follows a hysteresis curve in this way, the control section 200 preferably sets the first drive voltage and the second drive voltage based on a measurement result of the predetermined applied voltage and displacement characteristic of the first piezoelectric film 136 and the second piezoelectric film 138. Furthermore, the control section 200 causes the second piezoelectric film 138 to expand by applying to the second piezoelectric film 138 a second drive voltage that creates an electric field with an absolute value that is less than the absolute value of the coercive electric field of the second piezoelectric film. As a result, the control section 200 can increase the pressing force on the actuator 130 to turn ON the switching apparatus 100. In this way, the control section 200 can improve the switching speed.

The control section 200 may change offset voltages of the first drive voltage and the second drive voltage according to the usage time. The offset voltage can change even when the absolute value of the voltage for expanding or contracting the piezoelectric film remains substantially the same, according to the usage time of the piezoelectric film.

For example, if the piezoelectric film expands as a result of the control section 200 applying a drive voltage from 0 V to 5 V thereto in the initial state, when a prescribed usage time has passed, the same expansion cannot be achieved unless a drive voltage from 0.5 V to 5.5 V is applied. In such a case, the control section 200 can expand or contract the piezoelectric film by adding an offset voltage of 0.5 V to the voltage from 0 V to 5 V used initially.

In this way, the control section 200 changes the offset voltages for the first drive voltage and the second drive voltage according to the usage time, and supplies the resulting voltages to the first piezoelectric film 136 and the second piezoelectric film. In this case, the voltage output section 182 and the voltage output section 192 respectively output a voltage obtained by adding the corresponding offset voltage to the first drive voltage and the second drive voltage, according to a control signal from the control section 200.

The control section 200 may change the offset voltages of the first drive voltage and the second drive voltage according to the ambient temperature of the actuator 130. The offset voltage can change even when the absolute value of the voltage for expanding or contracting the piezoelectric film remains substantially the same, according to the ambient temperature. In this case, the control section 200 can change the offset voltages for the first drive voltage and the second drive voltage according to the ambient temperature, and supply the resulting voltages to the first piezoelectric film 136 and the second piezoelectric film.

Figure 5:
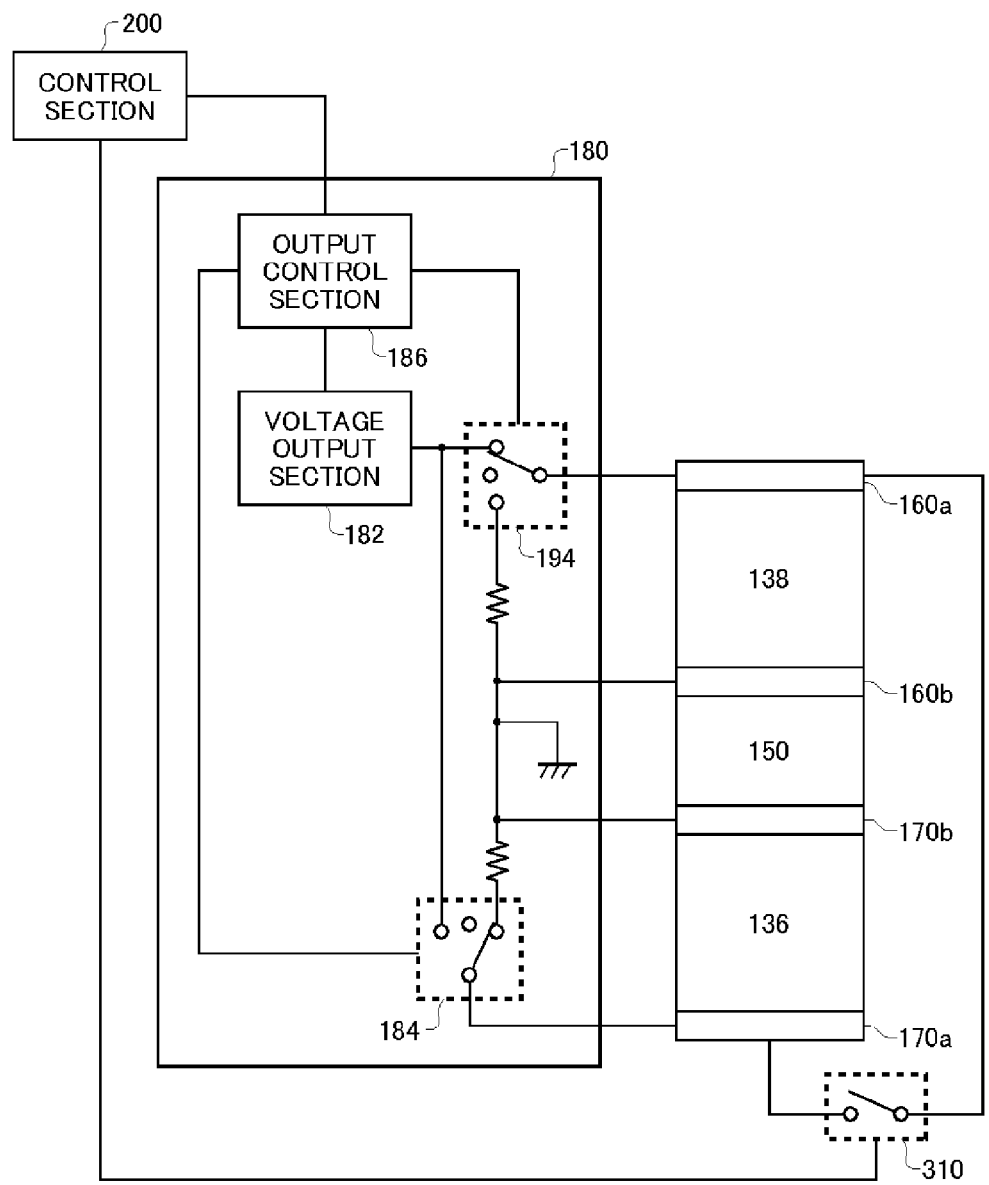
FIG. 5 shows the first power supply section 180, the second power supply section 190, and the control section 200 according to a modification of the present embodiment, along with the actuator 130.

FIG. 5 shows the first power supply section 180 and the control section 200 according to a modification of the present embodiment, along with the actuator 130. In the switching apparatus 100 of the present modification, components that have substantially the same operation as components of the switching apparatus 100 described in relation to FIG. 3 are given the same reference numerals, and redundant descriptions are omitted.

The first power supply section 180 switches between supplying the first drive voltage and supplying the second drive voltage to the actuator 130. When brining the first contact point 122 and the second contact point 134 into contact with each other, the first power supply section 180 sets a first drive voltage causing the first piezoelectric film 136 to contract as the output voltage from the voltage output section 182, and applies this first drive voltage to the first piezoelectric film 136. In this case, the output switching section 184 connects the voltage output section 182 to the electrode layer 170a, and the output switching section 194 disconnects the voltage output section 182 from the electrode layer 160a. Here, the output switching section 194 may remove the charge accumulated in the electrode layer 160a by connecting the electrode layer 160a to the reference potential of 0 V.

When switching the first contact point 122 and the second contact point 134 from the connected state to the separated state, the first power supply section 180 causes the output switching section 184 to stop supplying voltage, sets the output voltage from the voltage output section 182 to be a second drive voltage that causes the second piezoelectric film 138 to contract, and applies this second drive voltage to the second piezoelectric film 138 to bias the actuator 130 toward the original position. Here, the output switching section 184 may remove the charge accumulated in the electrode layer 170a by connecting the electrode layer 170a to the reference potential of 0 V.

In the switching apparatus 100, the first piezoelectric film 136 and the second piezoelectric film 138 are preferably formed on the surface of the support layer 150, such that the first drive voltage and the second drive voltage are substantially the same voltage. As a result, the switching apparatus 100 can switch the output voltage from the voltage output section 182 to be the first drive voltage or the second drive voltage, and supply this voltage to the first piezoelectric film 136 or the second piezoelectric film 138. Furthermore, in the switching apparatus 100, when the first drive voltage and the second drive voltage are different voltages, the output control section 186 may set first drive voltage or the second drive voltage for the voltage output section 182 and cause the voltage output section 182 to output the set drive voltages in synchronization with the switching of the output switching section 184, according to a control signal from the control section 200.

The switching apparatus 100 further includes an electrode connecting section 310. The electrode connecting section 310 electrically connects an electrode layer to which a drive potential is applied to the next electrode layer to which a drive potential is supplied. Furthermore, the electrode connecting section 310 cuts off the electrical connection between the electrode layers when the drive potential is being applied to the electrode layers.

When setting the first contact point 122 and the second contact point 134 to the separated state, the control section 200 switches the electrode connecting section 310 to the connected state to move the charge accumulated in the first piezoelectric film 136 to the second piezoelectric film 138. After the charge has been moved, the control section 200 switches the electrode connecting section 310 to the disconnected state and then sets the first contact point 122 and the second contact point 134 to the separated state.

The control section 200 may set the first contact point 122 and the second contact point 134 to the contact state by connecting the voltage output section 182 to the electrode layer 170a via the output switching section 184, such that the first drive voltage is supplied to the electrode layer 170a, for example. The following describes how the control section 200 switches from this state to a state in which the first contact point 122 and the second contact point 134 are separated from each other.

First, the control section 200 sets the output switching section 184 to the disconnected state. While keeping the electrode layer 170a separated from the reference voltage, the output switching section 184 disconnects the electrode layer 170a from the voltage output section 182. Next, the control section 200 switches the electrode connecting section 310 to the connected state, thereby connecting the electrode layer 160a to the electrode layer 170a and causing the charge accumulated in the first piezoelectric film 136 to move to the second piezoelectric film 138.

After the charge has moved, the control section 200 switches the electrode connecting section 310 to the disconnected state. Here, if the first drive voltage is different from the second drive voltage, the control section 200 may transmit a control signal that causes the output control section 186 to output the second drive voltage, in order to output the second drive voltage from the voltage output section 182. Next, the control section 200 connects the voltage output section 182 to the electrode layer 160a via the output switching section 194, so that the second drive voltage is applied to the electrode layer 160a and the actuator 130 is biased to return to the initial position.

In this way, prior to applying the second drive voltage to the second piezoelectric film 138, the control section 200 moves the charge accumulated in the first piezoelectric film 136 to the second piezoelectric film 138. As a result, the control section 200 can decrease the energy consumed when driving the actuator 130.

The above modification provides an example in which the control section 200 sets the first contact point 122 and the second contact point 134 to the disconnected state, but instead, when setting the first contact point 122 and the second contact point 134 to the connected state, the control section 200 may move the charge accumulated in the second piezoelectric film 138 to the first piezoelectric film 136 in the same manner. Prior to applying the first drive voltage to the first piezoelectric film 136, the control section 200 can move the charge accumulated in the second piezoelectric film 138 to the first piezoelectric film 136, thereby decreasing the power consumption.

Figure 6:
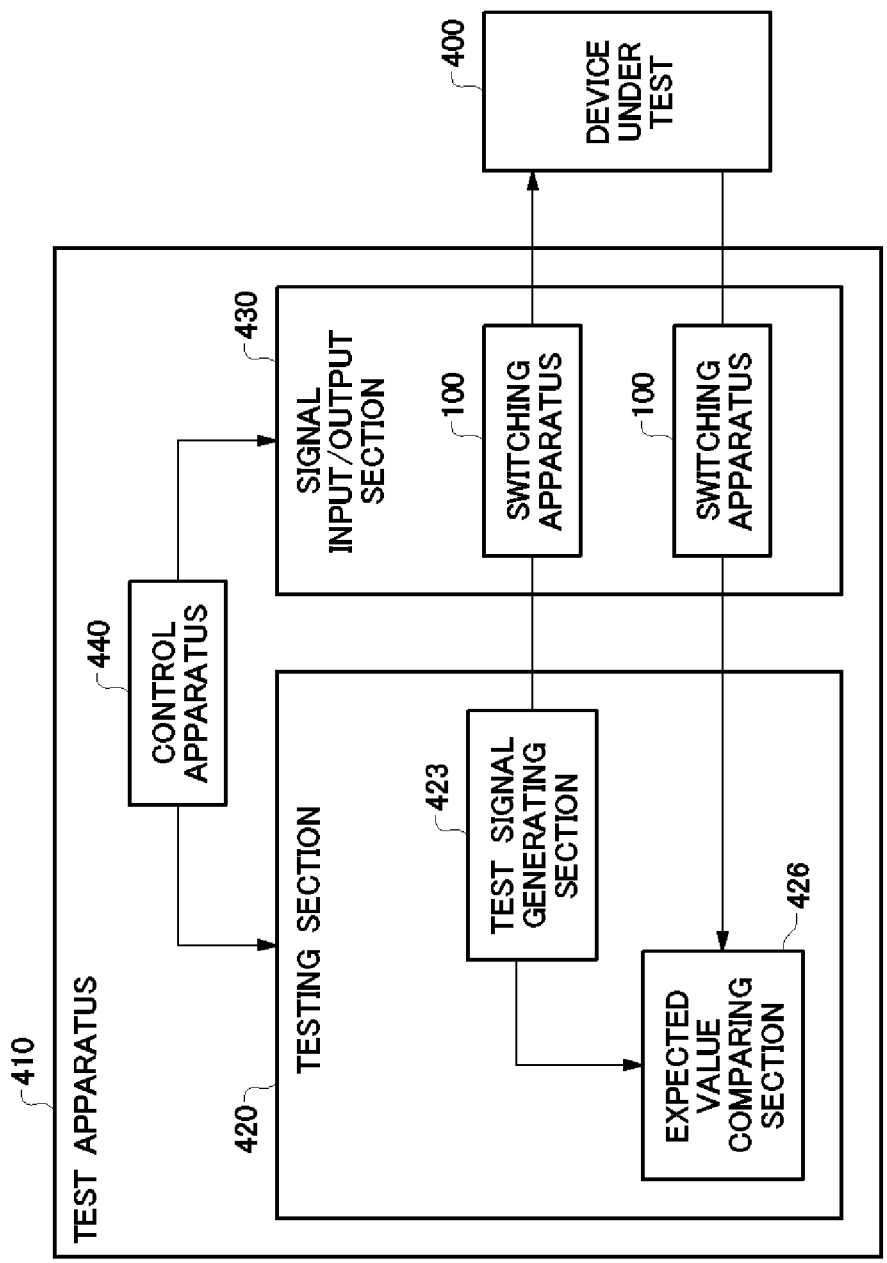
FIG. 6 shows an exemplary configuration of a test apparatus 410 according to the present embodiment, along with a device under test 400.

FIG. 6 shows an exemplary configuration of a test apparatus 410 according to the present embodiment, along with a device under test 400. The test apparatus 410 tests at least one device under test 400, which may be an analog circuit, a digital circuit, an analog/digital mixed circuit, a memory, or a system on chip (SOC), for example. The test apparatus 410 supplies the device under test 400 with a test signal based on a test pattern for testing the device under test 400, and judges pass/fail of the device under test 400 based on an output signal output by the device under test 400 in response to the test signal.

The test apparatus 410 includes a testing section 420, a signal input/output section 430, and a control apparatus 440. The testing section 420 tests the device under test 400 by exchanging electric signals with the device under test 400. The testing section 420 includes a test signal generating section 423 and an expected value comparing section 426.

The test signal generating section 423 generates a plurality of test signals to be supplied to the device under test 400. The test signal generating section 423 may generate expected values for the response signals output by the device under test 400 in response to the test signals. The test signal generating section 423 may be connected to a plurality of devices under test 400 via the signal input/output section 430 to test the plurality of devices under test 400.

The expected value comparing section 426 compares the reception data value received by the signal input/output section 430 to an expected value. The expected value comparing section 426 may receive the expected value from the test signal generating section 423. The test apparatus 410 may judge pass/fail of the device under test 400 based on the comparison result of the expected value comparing section 426.

The signal input/output section 430 is connected to one or more devices under test 400 and exchanges the test signals between the test apparatus 410 and the device under test 400. The signal input/output section 430 may be a performance board mounted on a plurality of devices under test 400. The signal input/output section 430 includes the switching apparatus 100.

The switching apparatus 100 is provided between the testing section 420 and the device under test 400, and provides an electrical connection or disconnection between the testing section 420 and the device under test 400. The test apparatus 410 performs electrical connecting or disconnecting using the switching apparatus 100 according to the present embodiment.

The present embodiment describes an example in which the signal input/output section 430 is connected to one device under test 400, and one switching apparatus 100 is provided to each of the input signal line and the output signal line of the one device under test 400. Instead, the signal input/output section 430 may be connected to a plurality of devices under test 400, and one switching apparatus 100 may be provided to each input signal line and output signal line of each device under test 400. If there is one input/output signal line connecting the signal input/output section 430 to the device under test 400, one switching apparatus 100 may be provided to the one input/output line.

The control apparatus 440 transmits a control signal to the testing section 420 and the signal input/output section 430, to begin execution of the testing by the test apparatus 410. The control apparatus 440 transmits a control signal that causes the testing section 420 to perform a comparison between the test result and the expected value or to generate a test signal, for example, according to a test program. Furthermore, according to the test program, the control apparatus 440 transmits to the signal input/output section 430 instructions for connecting the switching apparatuses 100 provided to signal input/output lines to be connected and instructions for disconnecting the switching apparatuses 100 provided to signal input/output lines to be disconnected.

The test apparatus 410 according to the present embodiment can control switching with low power consumption by controlling the voltage, and can perform testing using the switching apparatus 100 that prevents the contact points from sticking together.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A switching apparatus comprising:
   a contact point section including a first contact point;
   an actuator including a first piezoelectric film that expands and contract according to a first drive voltage and a second piezoelectric film that is provided in parallel with the first piezoelectric film and expands and contract according to a second drive voltage, the actuator moving a second contact point to contact or move away from the first contact point according to the contraction and expansion of the first piezoelectric film and the second piezoelectric film; and
   a control section that controls the first drive voltage and the second drive voltage, wherein
   when causing the first contact point and the second contact point to contact each other, the control section applies the first drive voltage causing the first piezoelectric film to contract to the first piezoelectric film, such that the actuator bends toward the first piezoelectric film, and
   when switching the first contact point and the second contact point from a contact state to a separated state, the control section stops supplying the first drive voltage and applies the second drive voltage causing the second piezoelectric film to contract to the second piezoelectric film, such that the actuator is biased to return.

2. The switching apparatus according to claim 1, wherein the control section switches whether the actuator is biased to return by the second piezoelectric film according to a state of the actuator.

3. The switching apparatus according to claim 2, wherein the control section switches whether the actuator is biased to return by the second piezoelectric film according to cumulative usage time of the actuator.

4. The switching apparatus according to claim 2, wherein the control section sets an initial position occurring when the first contact point and the second contact point are in the separated state as the state of the actuator.

5. The switching apparatus according to claim 2, wherein the control section switches whether the actuator is biased to return by the second piezoelectric film according to desired switching speed.

6. The switching apparatus according to claim 1, wherein when setting the first contact point and the second contact point to the separated state, the control section removes charge accumulated in the first piezoelectric film.

7. The switching apparatus according to claim 1, wherein when setting the first contact point and the second contact point to the separated state, the control section moves charge accumulated in the first piezoelectric film to the second piezoelectric film.

8. The switching apparatus according to claim 1, wherein when setting the first contact point and the second contact point to the contact state, the control section applies the first drive voltage causing the first piezoelectric film to contract, and applies a second drive voltage causing the second piezoelectric film to expand by providing an electric filed that is weaker than a coercive electric field of the second piezoelectric film.

9. The switching apparatus according to claim 8, wherein the control section supplies predetermined voltages as the first drive voltage and the second drive voltage to the corresponding first piezoelectric film and second piezoelectric film.

10. The switching apparatus according to claim 9, wherein the control section changes an offset voltage of each of the first drive voltage and the second drive voltage, according to usage time.

11. The switching apparatus according to claim 9, wherein the control section changes an offset voltage of each of the first drive voltage and the second drive voltage, according to ambient temperature of the actuator.

12. The switching apparatus according to claim 1, wherein the first piezoelectric film and the second piezoelectric film are each a PZT film.

13. A test apparatus that tests a device under test, comprising:
 a testing section that tests the device under test by exchanging electrical signals with the device under test; and
 the switching apparatus according to claim 1 that is provided between the testing section and the device under test and provides an electrical connection or disconnection between the testing section and the device under test.

* * * * *